(12) United States Patent
Male (10) Patent No.: US 6,639,395 B2
(45) Date of Patent: Oct. 28, 2003

(54) CURRENT SENSOR WITH INPUT/OUTPUT ISOLATION

(75) Inventor: Barry Jon Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 10/029,538

(22) Filed: Dec. 21, 2001

(65) Prior Publication Data

US 2003/0117127 A1 Jun. 26, 2003

(51) Int. Cl.$^7$ ............................................. G01R 21/02
(52) U.S. Cl. ...................................... 324/106; 324/105
(58) Field of Search ........................ 324/95, 104, 105, 324/106, 117 R, 117 H, 126

(56) References Cited

U.S. PATENT DOCUMENTS 4,789,823 A * 12/1988 Delfs et al. .................... 324/95
6,121,766 A * 9/2000 Beardmore ................. 324/106

* cited by examiner

Primary Examiner—Kamand Cuneo
Assistant Examiner—Minh N. Tang
(74) Attorney, Agent, or Firm—W. Daniel Swayze, Jr.; W. James Brady; Frederick J. Telecky, Jr.

(57) ABSTRACT

A current sensor and a method for measuring currents on an integrated circuit in an isolated manner. The current sensor uses a Peltier device as a thermal difference generator to generate a first temperature at a temperature generating junction and a second temperature at a second temperature generating junction. The two temperature generating junctions being spaced apart from one another and where the temperature difference between the first and second temperatures is a function of the sampled current. A Seebeck transducer operating as a thermal difference sensor has a first temperature sensing junction thermally coupled to the first temperature generating junction and a second temperature sensing junction thermally coupled to the second temperature generating junction. The thermal difference detector detects the temperature difference between the first and second temperature sensing junctions and provides a measurement signal that is indicative of the temperature difference between the two temperature sensing junctions that is indicative of the measured current.

12 Claims, 4 Drawing Sheets

CURRENT SENSOR WITH INPUT/OUTPUT ISOLATION

BACKGROUND OF THE INVENTION

Electrical isolation between a current sensing and measurement system and an electrical circuit that contains the sampled current is an important consideration in the design and implementation of current sensing and measurement systems. Ideally, a current sensing and measurement system should not affect the operation of the circuit that contains the sampled current by removing current, i.e., the current measurement system should have a nearly zero insertion loss. In addition, the current sensing and measurement system should not inject electrical noise or other interfering signals into either the sampled current or other components and currents within the circuit or other nearby circuits. The current sensing and measurement system should also have a well defined, e.g., linear, relationship between the measured current and the output signal provided by the current sensing and measurement system over the expected range of currents. For measuring currents within integrated circuits, the current sensor should also be easily integrated onto the integrated circuit.

Typically, prior art current measurement systems rely upon a resistance sensor that converts the measured current into a sensed voltage signal and provides the voltage signal to a high impedance sensing front end amplifier that is used to condition the sensed voltage signal. The conditioned signal is transmitted across an isolating barrier using magnetic, capacitive, or optical transmission means. These prior art techniques, however, require the transmission of power backward across the isolating barrier to bias the high impedance sensing front end amplifier and to provide any necessary power to the magnetic, capacitive, or optical transmission means. In other prior art current sensing and measurement systems, Hall effect sensors, magneto-resistive devices, and flux gate devices are used to isolate the sampled current and provide an output signal indicative of the measured current.

Because these prior art devices required power to be transferred in the reverse direction across the barrier to bias and power the front end devices, noise or interfering signals can be introduced into the measured current, the circuit containing the measured current, or other nearby circuits or components. Also, these prior art methods may introduce a significant insertion loss to the circuit containing the sampled current due to the resistance used to sample the current. Furthermore, Hall effect sensors, flux gate devices, and magneto resistive devices are not easily integrated onto an integrated circuit and, through the presence of the magnetic fields that are required for their operation, these devices can interfere with other devices and circuits on the integrated circuit or that are physically proximate thereto. Some of these magnetic based systems also may have poor linearity over the expected range of currents.

Therefore, it would be advantageous to provide a current sensor for an integrated circuit that provides for low insertion loss, has high isolation, that has a well defined relationship over the expected range of current, is easily placed on an integrated circuit, and does not inject noise or interfering signals into the other devices on the integrated circuit.

BRIEF SUMMARY OF THE INVENTION

A current sensor and a method for measuring currents on an integrated circuit that uses a thermal difference generator that generates a first temperature at a temperature generating junction and a second temperature at a second temperature generating junction, where the two temperature generating junctions are spaced apart from one another, where the temperature difference between the first and second temperatures is a function of the sampled current. A thermal difference detector has a first temperature sensing junction thermally coupled to the first temperature generating junction and a second temperature sensing junction thermally coupled to the second temperature generating junction. The thermal difference detector detects the temperature difference between the first and second temperature sensing junctions and provides a measurement signal that is indicative of the temperature difference between the two temperature sensing junctions. The temperature difference being indicative of the sampled current.

In one embodiment, the current sensor is formed on a silicon die and includes a first thermal difference generator that has a current input portion consisting of a first conductive material physically coupled to a current transfer portion consisting of a second conductive material dissimilar to the first conductive material. The current input portion and the current transfer portion are joined together and form a first temperature generating junction. The current transfer portion is coupled to a current output portion consisting of the first conductive material and forming a second temperature generating junction therewith. The sampled current is coupled to the current input portion, flows through the first temperature generating junction, across the current transfer portion, through the second temperature generating junction and is provided at the current output portion without significant loss. The current flowing through the first thermal difference generator results in the first thermal difference generator generating a first temperature at the first temperature generating junction and a second temperature at the second temperature generating junction, the first temperature being less than the second temperature.

The current sensor further includes a first thermal difference sensor. The first thermal difference sensor includes a first output portion consisting of a third conductive material that is physically coupled to a current transfer portion consisting of a fourth conductive material that is dissimilar to the third conductive material. The first output portion and the current transfer portion join together to form a first temperature sensing junction. A second output portion consisting of the third conductive material is physically coupled to the current transfer portion to form a second temperature sensing junction, wherein the second temperature sensing junction is spaced apart from the first temperature sensing junction. The first and second temperature sensing junctions are thermally coupled to the first and second temperature generating junctions respectively. The first temperature sensing junction is cooled to at least a portion of the temperature of the first temperature generating junction and the second temperature sensing junction is heated to at least a portion of the temperature at the second temperature generating junction. The first thermal difference generator senses the temperature difference between the first and second locations and provides an output signal that is a function of the temperature difference between the first and second temperature sensing junctions.

The current sensor further includes a dielectric barrier interposed between the first thermal difference generator and the first thermal difference sensor located.

Other forms, features, and aspects of the above-described methods and system are described in the detailed description that follows.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
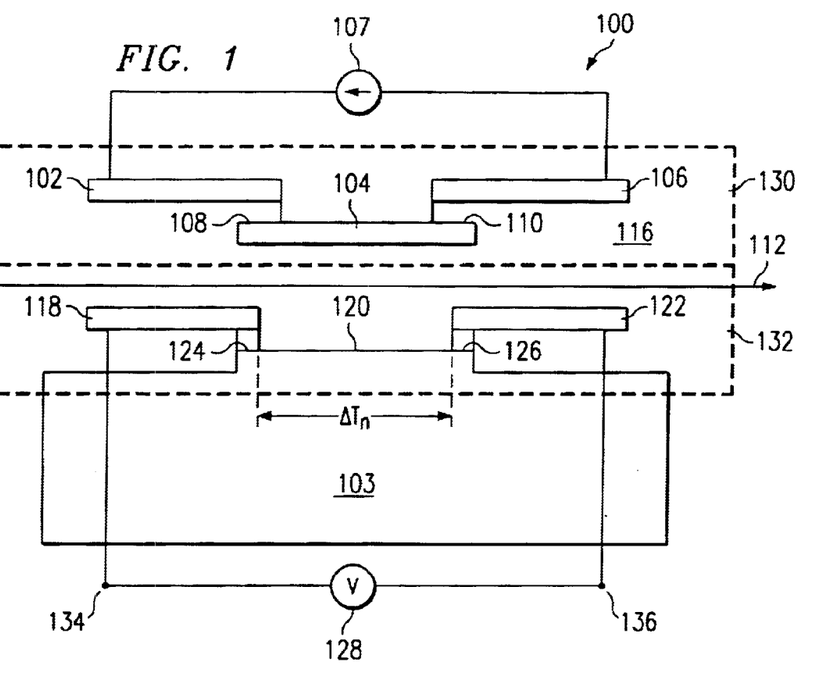
FIG. 1 is a cross sectional view of an embodiment of the current sensor described herein.

FIG. 1 depicts an embodiment of a current sensor and measurement system incorporating a thermal difference generator that generates a temperature difference that is indicative of the sampled current. The thermal difference generator is thermally coupled to a thermal difference sensor that provides an output signal that is a function of the sensed temperature difference and is therefore indicative of the magnitude of the sampled current. In particular, FIG. 1 depicts a current sensor cell 100 disposed on a silicon die 103, which can contain other integrated electronic circuit devices. The current sensor 100 includes a thermal difference generator 130 that utilizes a pair of dissimilar conductors configured and arranged as a thermoelectric Peltier device. A thermoelectric Peltier device includes two dissimilar conductors, or semiconductors, that are joined at two junctions that are physically spaced apart from one another and electrically connected by one of the two dissimilar conductors. A current flowing through the Peltier device results in heat transfer in the direction of the current flow. The first junction that receives the input current loses thermal energy as the electrical current flows to the second junction, thus cooling the first junction to a first temperature. The second junction receives the electrical current from the first junction and thermal energy that is transferred along with the electrical current, thus heating the second junction to a second temperature. The electrical current exits the Peltier device and is returned to the current source or circuit. The only resistance present in the device is the series resistance in the conductor that is used to electrically connect the first and second junction. Thus, a Peltier device will generate a temperature difference between a first and second junction that is a function of the input current.

A thermal difference sensor 132 utilizes a pair of dissimilar conductors configured and arranged as a thermoelectric Seebeck transducer. A Seebeck transducer includes two dissimilar conductors, or semiconductors, that are joined together at a pair of junctions that are physically spaced apart from one another and electrically connected by one of the two dissimilar conductors. When one of the junctions is at first temperature and the second junction is at a second temperature, a thermal EMF (voltage) is generated, wherein the thermal EMF is a function of the temperature difference of the two junctions. In the current sensor cell 100 depicted in FIG. 1, a first temperature sensing junction of the Seebeck transducer is thermally coupled to the first temperature generating junction of the Peltier device and is cooled thereby. Similarly, a second temperature sensing junction of the Seebeck transducer is thermally coupled to the second temperature generating junction of the Peltier device and is heated thereby.

In particular as depicted in FIG. 1, the thermal difference generator, the Peltier device, 130 includes a current input portion 102 that consists of a first conductive material. The current input portion 102 is electrically coupled to the sampled current source 101 and receives the sampled current therefrom. The current input portion 102 is physically coupled to a current transfer portion 104 at a first temperature generating junction 108, wherein the current transfer portion 104 consists of a second conductive material that is dissimilar to the first conductor. The current transfer portion 104 is physically coupled to a current output portion 106 at a second temperature generating junction 110 that is physically spaced apart from the first temperature generating junction 108. The current output portion 106 consists of the first conductive material and is electrically coupled to the sampled current source 101 and provides the sampled current return path thereto. As discussed above with respect to the Peltier generator, the current 101 flowing through the input portion 102, across the junction 108, through the current transfer portion 104, across the junction 110, and through the output portion 106 cools the first junction 108 and heats the second junction 110. Accordingly, the first junction 108 is cooled to a first temperature, $T_1$, and the second junction 110 is heated to a second temperature, $T_2$.

As further depicted in FIG. 1, the thermal difference sensor, i.e., the Seebeck transducer, 132 includes a first output portion 118 that consists of a third conductive material. The first output portion 118 is physically coupled to a current transfer portion 120 at a first temperature sensing junction 124, wherein the current transfer portion 120 consists of a fourth conductive material that is dissimilar to the third conductor. The current transfer portion 120 is physically coupled to a second output portion 122 at a second temperature sensing junction 126 that is physically spaced apart from the first temperature sensing junction 124. The second output portion 122 consists of the third conductive material. The first temperature sensing junction 124 is placed physically proximate to the first temperature generating junction 108 so as to be thermally coupled to the first temperature generating junction 108. The second temperature sensing junction 126 is placed physically proximate to the second temperature generating junction 110 so as to be thermally coupled to the second temperature generating junction 110. As discussed above with respect to the Seebeck sensor, an output voltage is produced by the Seebeck transducer when the first and second temperature sensing junctions are maintained at different temperatures wherein the output voltage is a function of the sensed temperature difference $\Delta T_H$. In the embodiment depicted in FIG. 1 the output sensor voltage is taken across the first and second output portion 118 and 122 respectively at terminals 134 and 136 where it is available for measurement or other processing.

A dielectric material 116 is disposed between the thermal difference generator 130 and the thermal difference sensor 132. The dielectric material 116 reduces the thermal transfer between first temperature generating junction 108 and the first temperature sensing junction 124 and between the second temperature generating junction 110 and the second temperature sensing junction 126. Accordingly, the thermal coupling of the first temperature generating junction 108, which is cooled to temperature T1, to the first temperature sensing junction 126 results in the cooling of the first temperature sensor to a temperature T1'. Typically, the temperature T1' is not equal to the temperature T1, and in general the temperature T1' is higher than the temperature T1. Similarly, the thermal coupling of the second temperature generating junction 110, which is heated to temperature T2, to the second temperature sensing junction 124 results in the heating of the second temperature sensing junction to a temperature T2'. Typically, the temperature T2' is not equal to the temperature T2, and in general the temperature T2' is lower than the temperature T2.

In the embodiment depicted in FIG. 1 the current sensor 100 is constructed as an integral component on a silicon integrated circuit 103. Some semiconductor manufacturing processes use copper as an extremely low resistance high current interconnect. Typically this copper interconnect is placed on top of a polymide-insulating layer that offers high breakdown voltages. Aluminum traces are also used at various levels in the process to act as electrical interconnects at those levels. Vias formed by the manufacturing process are used to interconnect traces of different levels. Thus, the first and second temperature generating junctions 108 and 110 of the thermal difference generator are formed by first and second vias respectively, that join the input portion 102 and the output portion 106 to the current transfer portion 104. In the embodiment depicted in FIG. 1, 102 and 106 are copper and 104 is an aluminum layer-3 metal.

The thermal difference sensor, i.e., the Seebeck transducer 132, can be constructed as an integral component on an integrated circuit as well. There are several choices of dissimilar materials available in a present semiconductor manufacturing processes to construct the first and second temperature sensing junctions 124 and 126 respectively. Two of the design considerations that are important to the selection of the materials is the proximity to the first and second temperature generating junctions 108 and 110 respectively, and the presence of parasitic elements. The first and second temperature sensing junctions may be formed at the intersection of a polysilicon conductor trace, an aluminum conductor trace and a contact. The contact provides the ohmic connection from a layer-1 metal to the polysilicon.

In the embodiment depicted in FIG. 1 an optional Faraday shield layer 112 is shown disposed between the thermal difference generator and the thermal difference sensor and being grounded to ground 119. The Faraday shield 112 is preferentially constructed of an aluminum metal 2 layer.

Figure 2:
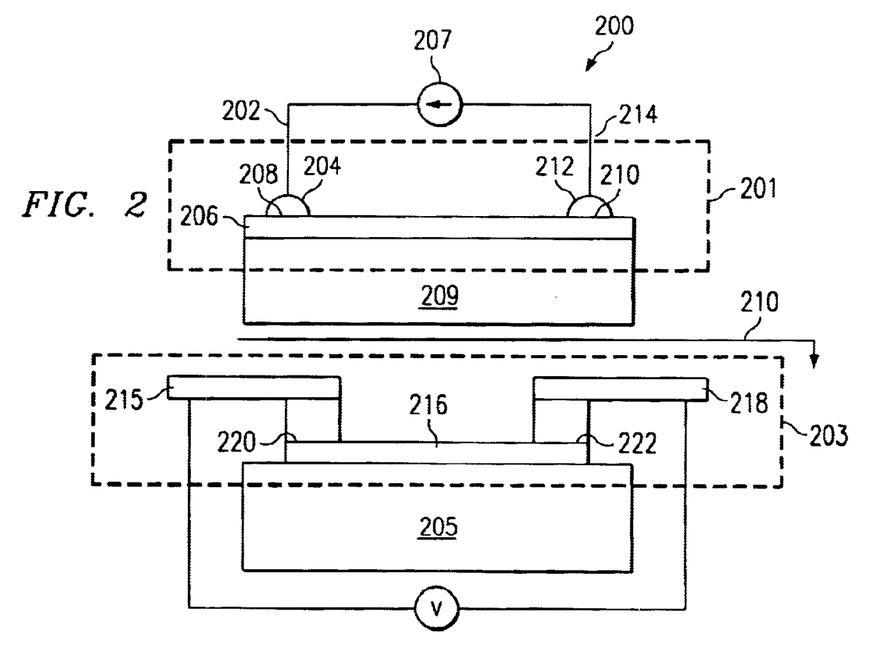
FIG. 2 is a cross sectional view of another embodiment of the current sensor described herein.

FIG. 2 depicts another embodiment of a current sensor cell 200 that is disposed on a silicon die. The current sensor cell 200 employs a Peltier device as a temperature difference generator 201, and a Seebeck transducer as a temperature difference sensor 203 that is thermally coupled to the temperature difference generator 201. The current sensor cell 200 operates in a similar manner to the embodiment depicted in FIG. 1. However, the structure of the Peltier device 201 is structurally different from the embodiment depicted in FIG. 1 while the structure of the Seebeck transducer 203 is substantially the same.

In particular as depicted in FIG. 2, the Peltier device 201 includes a first bondwire 202 bonded by a first conductive pad 204 to a current transfer portion 206 forming a first temperature generating junction 208. A second bondwire 214 is bonded by a second conductive pad 212 to the current transfer portion 206 forming a second temperature generating junction 210. In the embodiment depicted in FIG. 2, the first and second bond wires 202 and 214 and the first and second conductive pads 204 and 212 consist of a first conductive material, and the current transfer portion 206 consists of a second conductive materials that is dissimilar to the first conductive material. In one embodiment, the first conductive material is aluminum or gold and the second conductive material is copper. The second conductive pad 210 is spaced apart from the first conductive pad 208, and is electrically coupled to the first pad 208 via the current transfer portion 206. The first bondwire 202 is coupled to the sampled current source 207 and receives the current therefrom as input current to the current sensor cell. A return path for the sampled current is provided by via the second bondwire 214 that is coupled to the sampled current source 207. As discussed above with reference to FIG. 1, and the Peltier generator described therein, the current 207 flowing through the first bondwire 202, across the first temperature generating junction 208, through the current transfer portion 206, across the second temperature generating junction 210, and through the second bondwire 214, cools the first temperature generating junction 208 and heats the second temperature generating junction 210. Accordingly, the first junction 208 is cooled to a first temperature, $T_1$, and the second junction 210 is heated to a second temperature, $T_2$.

As further depicted in FIG. 2, the thermal difference sensor, i.e., the Seebeck transducer, 203 includes a first output portion 215 that consists of a third conductive material. The first output portion 215 is physically coupled to a current transfer portion 216 at a first temperature sensing junction 220, wherein the current transfer portion 216 consists of a fourth conductive material that is dissimilar to the third conductive material. The current transfer portion 216 is physically coupled to a second output portion 218 at a second temperature sensing junction 222 that is physically spaced apart from the first temperature sensing junction 220. The second output portion 218 consists of the third conductive material. The first temperature sensing junction 220 is placed physically proximate to the first temperature generating junction 208 so as to be thermally coupled to the first temperature generating junction 208. The second temperature sensing junction 222 is placed physically proximate to the second temperature generating junction 210 so as to be thermally coupled to the second temperature generating junction 210. As discussed above with respect to the Seebeck sensor, an output voltage is produced by the Seebeck transducer when the first and second temperature sensing junctions 220 and 222 are maintained at different temperatures wherein the output voltage is a function of the temperature difference $\Delta T_H$. In the embodiment depicted in FIG. 2 the output sensor voltage is taken across the first and second output portion 214 and 218 respectively at terminals 215 and 218 where it is available for measurement or other processing.

A dielectric material 209 is disposed between the thermal difference generator 201 and the thermal difference sensor 203. This dielectric material 209 isolates the input and output circuits and also reduces the thermal transfer between first temperature generating junction 208 and the first temperature sensing junction 220 and between the second temperature generating junction 210 and the second temperature sensing junction 222. Accordingly, the thermal coupling of the first temperature generating junction 208, which is cooled to temperature T1, to the first temperature sensing junction 220 results in the cooling of the first temperature sensor to a temperature T1'. Typically, the temperature T1' will not equal the temperature T1, and in general the temperature T1' is higher than the temperature T1. Similarly, the thermal coupling of the second temperature generating junction 210, which is heated to temperature T2, to the second temperature sensing junction 222 results in the heating of the second temperature sensing junction to a temperature T2'. Typically, the temperature T2' will not equal the temperature T2, and in general the temperature T2' is lower than the temperature T2.

As discussed above with respect to FIG. 1, the current sensor cell 200 can be constructed as an integral component on an integrated circuit. Some semiconductor manufacturing processes use copper as an extremely low resistance high current interconnect and typically this copper interconnect is placed on top of a polymide-insulating layer that offers high breakdown voltages. In the embodiment illustrated in FIG. 2, the first and second temperature sensing junctions, 220 and 222 respectively are formed proximate to the temperature generating junctions 208 and 210. As illustrated in FIG. 2 the temperature generating junctions 208 and 210 are formed where an aluminum or gold bondwire and bonding pad are bonded to the top surface of the copper interconnect. The thermal difference sensor, i.e., the Seebeck transducer 203, can be constructed as described above with respect to FIG. 1.

In general, in the embodiments described above, the relationship between the magnitude of the measured current and the generated temperature difference is linear, wherein the typical thermal voltage generated by a polysilicon-aluminum pair is approximately 0.7 mV/C. For a given range of current, the overall gain of the temperature difference generator system is low. The generated temperature difference is dependent upon the conductor geometries used in the layout on the silicon die, and upon the types of conductors used. The current transfer portion 104 and 206 are both conductive materials and therefore shunt the generated thermal energy away from the first and second temperature generating junctions. In addition, the illustrated embodiment depicts the current transfer portion 104 in FIG. 1 and the current transfer portion 206 in FIG. 2 as a straight linear thermal path between the first and second junctions 108, 110 in FIG. 1 and 208, 210 in FIG. 2. However, the respective conductor path may be curved, thereby lengthening the thermal path and reducing the thermal shunting effects of the conductors.

Furthermore, as discussed above with respect to both the described embodiments, the temperature that is sensed by the Seebeck transducer is less than the actual temperature generated by the Peltier device due to losses that are inherent in the system. As depicted in FIG. 1 and FIG. 2 the dielectric materials 116 and 209 respectively that are disposed between the Peltier device and the Seebeck transducer reduces the thermal transfer therebetween. In the embodiment depicted in FIG. 1 silicon dioxide is the dielectric material that is used. In the embodiment depicted in FIG. 2, polymide is the dielectric material, although other dielectrics may be used depending on their availability in the particular semiconductor processing methodology. In another embodiment, the Peltier device and the Seebeck transducer may be mechanically suspended so that air is the dielectric disposed around the temperature difference generator and sensor. Advantageously when air is the dielectric disposed around the temperature difference generator and sensor, the thermal shunting effects of the bulk silicon and the dielectric material outside the generator and sensor are greatly reduced. This increases the gain of the temperature difference generator and sensor by increasing the thermal coupling therebetween. In addition, if a Faraday shield, 108 in FIG. 1 and 210 in FIG. 2 is inserted between the temperature difference generator and sensor, the thermal transfer will also be reduced due to the thermal conduction and shunting of the conductor used in the Faraday shield, but has the benefit of removing dynamic signal coupling between the input and output circuits.

As discussed above, the embodiments described herein have a low gain linear transfer function. The low gain of the transfer function is due to the low inherent gain of the Peltier device and the Seebeck transducer, the thermal shunting affect of the conductors used in both the devices, the reduced heat transfer due to the dielectric disposed between the temperature difference generator and sensor, and the lower heat transfer due to the use of a Faraday shield. As such, a Peltier device in which the first and second temperature generating junctions are points and a Seebeck transducer that has only a single pair of temperature sensing junctions may be of relatively limited use. Accordingly, for a current measurement system having a higher gain, given the limitations discussed above, the thermal difference generator can include the first and second vias as linear structures for producing more heat by providing a greater joined surface area between the two dissimilar conductors. Furthermore, the thermal difference generator can include a plurality of temperature sensing junctions.

Figure 3:
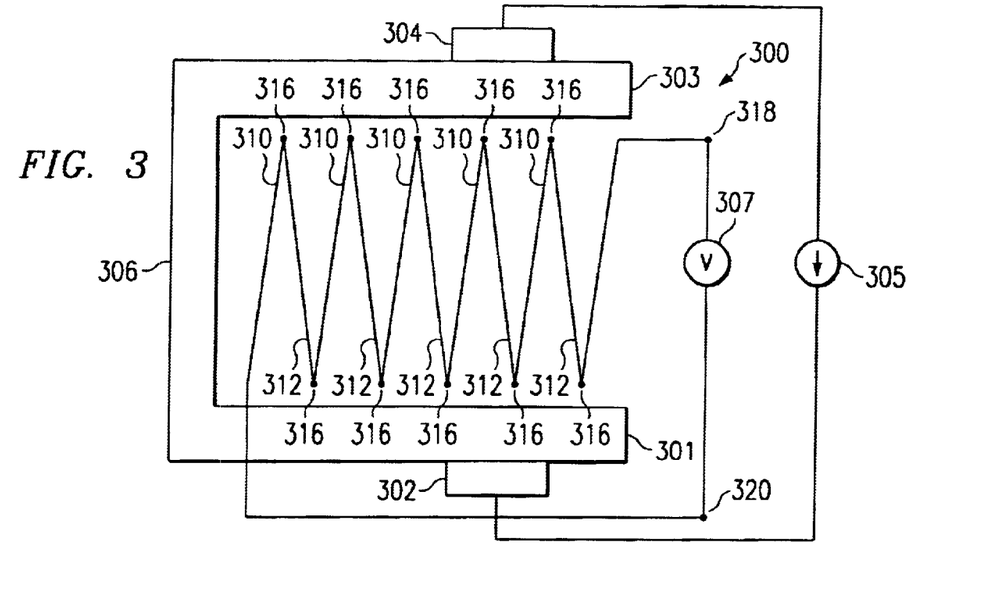
FIG. 3 is top view of the embodiment of the current sensor depicted in FIG. 1.

FIG. 3 depicts an embodiment of a current sensor employing a plurality of temperature difference sensing cells similar to those depicted in FIG. 1. FIG. 3 depicts a current sensor 300 for sampling a sampled current 305 coupled to the current sensor through a current input portion 302. The current input portion 302 and a current transfer portion 306 consist of dissimilar conductors. The current input portion 302 and the current transfer portion 306 are joined together by a first via 301 forming a temperature generating junction, which as discussed above is the "cold" via. A current output portion 306 consisting of the same material as the current input portion 302 is joined with the current transfer portion 306 in a second via 303, forming a second temperature generating junction. The second via 303 is electrically connected to the first via 301 via the current transfer portion 306. In the illustrated embodiment, the current input and output portions 302 and 304 respectively consist of copper interconnect and the current transfer portion 306 consists of aluminum traces. The current output portion 304 returns the sampled current to the current source 305.

A Seebeck transducer includes a plurality of first temperature sensing conductors 310 and a plurality of second temperature sensing conductors 312 that are interconnected at a plurality of temperature sensing junctions 316. Approximately one-half the plurality of temperature sensing junctions 316 are disposed beneath the temperature generating junction in via 301 and thermally coupled thereto. The other approximately one-half of the plurality of the temperature sensing junctions 316 are disposed beneath the temperature generating junction in via 303 and are thermally coupled thereto. In one embodiment, the first temperature sensing conductors 310 consist of aluminum traces and the second temperature sensing conductors 312 consist of polysilicon traces. As discussed above, each polysilicon-aluminum temperature sensing junction 316 generates approximately 0.7 mV/C. The choice of length of the cold and hot vias, and the number of temperature sensing junctions are determined as a function of the various current measurement system parameters. The output signal is provided across terminals 318 and 320 for measurement and other processing.

Figure 4:
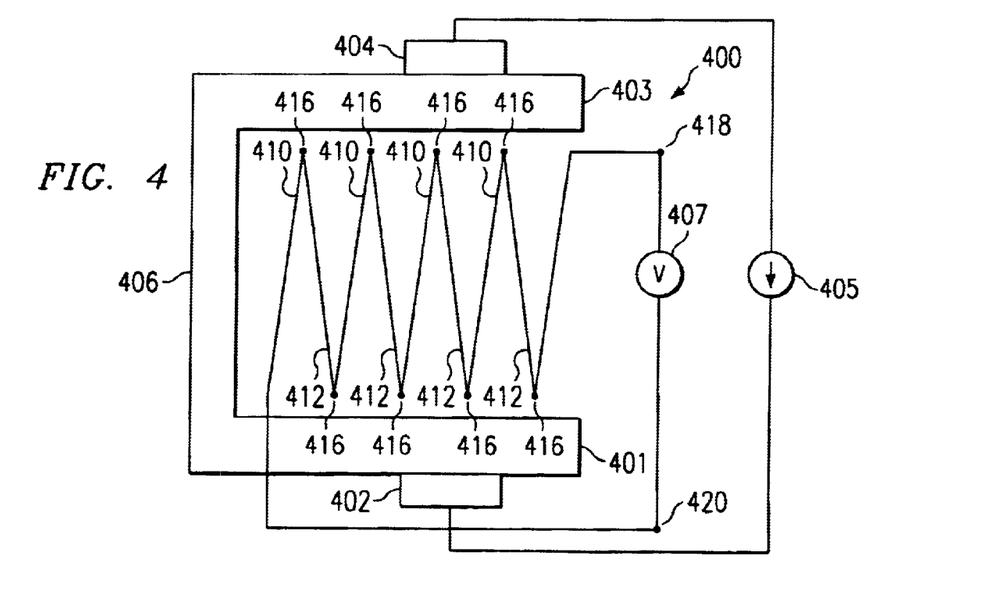
FIG. 4 is top view of the embodiment of the current sensor depicted in FIG. 2.

FIG. 4 depicts an embodiment of a current sensor employing a plurality of current sensing cells depicted in FIG. 2.

FIG. 4 depicts a current sensor 400 that includes a sampled current 405 coupled to the current sensor through a first bondwire 402 that in the illustrated embodiment consists of gold or aluminum. A current transfer portion 406 that in the illustrated embodiment consists of copper is joined in a first via 401, forming a first temperature generating junction therein. A second bondwire 404 consisting of the same material as the first bondwire 402 is joined with the current transfer portion 406 in a second via 403 forming a second temperature generating junction therein. In addition, the current transfer portion 406 electrically connects the first via 401 to the second via 403. The second bondwire 404 returns the sampled current to the current source 405. A thermal difference sensor includes a plurality of first temperature sensing conductors 410 and a plurality of second temperature sensing conductors 412 that are interconnected to form temperature sensing junctions 416. Approximately one-half the plurality of temperature sensing junctions 416 are disposed beneath the temperature generating junction in via 401 and are thermally coupled thereto. The other approximately one-half of the plurality of temperature sensing junctions are disposed beneath the temperature generating junction in via 403 and are thermally coupled thereto. The output signal is available across terminals 418 and 420 for measurement and other processing. In the illustrated embodiment, the first plurality of temperature sensing conductors 410 consist of aluminum traces and the second plurality of temperature sensing conductors 412 consist of polysilicon traces. As discussed above, each polysilicon-aluminum pair generates approximately 0.7 mV/C. The choice of length of the cold and hot vias, and the number of temperature sensing junctions are a function of the various current measurement system parameters.

Figure 5:
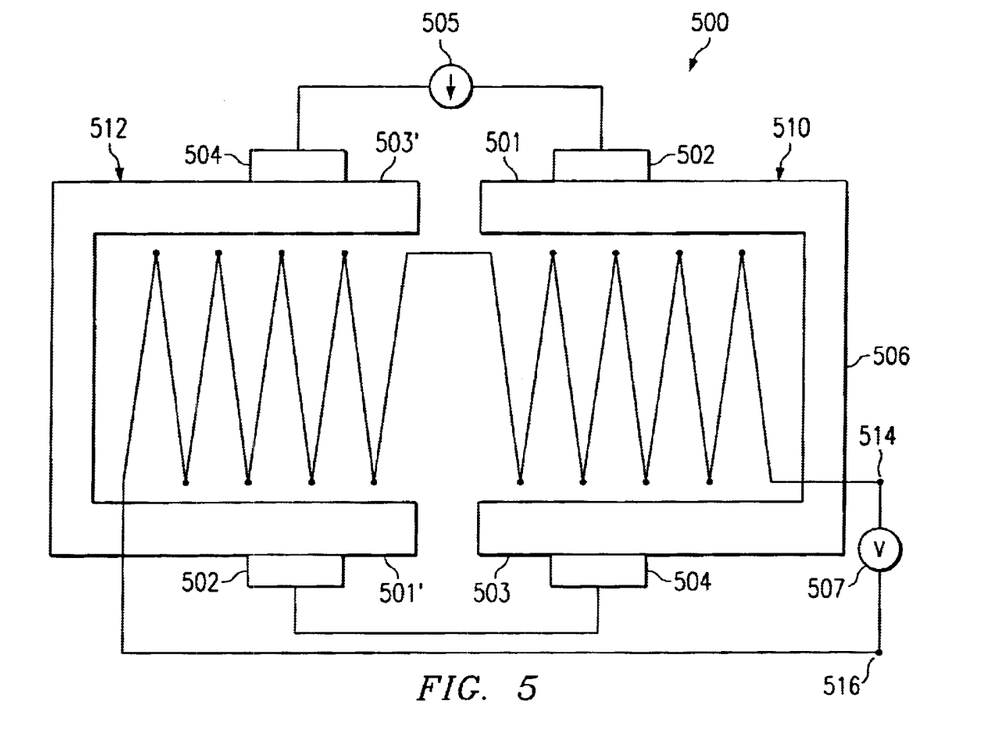
FIG. 5 is a top view of a pair of cross-coupled current sensors.

Often on an integrated circuit other components will generate heat that may interfere with the temperature sensors used in the current measurement system described herein. FIG. 5 depicts an arrangement of two current sensor modules that reduces or substantially eliminates the sensitivity of the current sensor to temperature gradients external to the current sensor. Each of the current sensor modules has a pair of temperature generating junctions and a plurality of temperature sensing junctions coupled to one or the other temperature generating junction.

In particular, FIG. 5 depicts a current sensor 500 including a cross-coupled pair of current measurement cells. The current measurement cells can be either of the embodiments depicted in FIGS. 3 and 4. In particular, FIG. 5 depicts a first current measurement cell 510 and a second current measurement cell 512 that is adjacent to the first current measurement cell 510 and is oriented in an opposite thermal and electrical configuration. A sampled current 505 is applied to the first current measurement cell 510 forming the cold via 501, as discussed above. The sampled current flows through the first current measurement cell 510 and exits by the hot via 503. The sampled current is then applied to the second current measurement cell 512 forming a cold via 501'. The sampled current flows through the second current measurement cell 512 and exits by the hot via 503'. The cold via 501 of the first measurement cell 510 is adjacent to the hot via 503' of the second measurement cell 512. Similarly, the hot via 503 of the first measurement cell 510 is adjacent to the cold via 501' of the second measurement cell 512. In this configuration a temperature gradient external to the current sensor will cause equal differential voltages of opposite polarity to be generated by the first and second current measurement cells 510 and 512 respectively. The two differential voltages will substantially cancel out one another eliminating the interfering effect of the external temperature gradient. The output signal is available across terminals 514 and 516 for measurement and other processing. Although only two current measurement cells are illustrated in the embodiment depicted in FIG. 5, any even number of current measurement cells may be employed.

Figure 6:
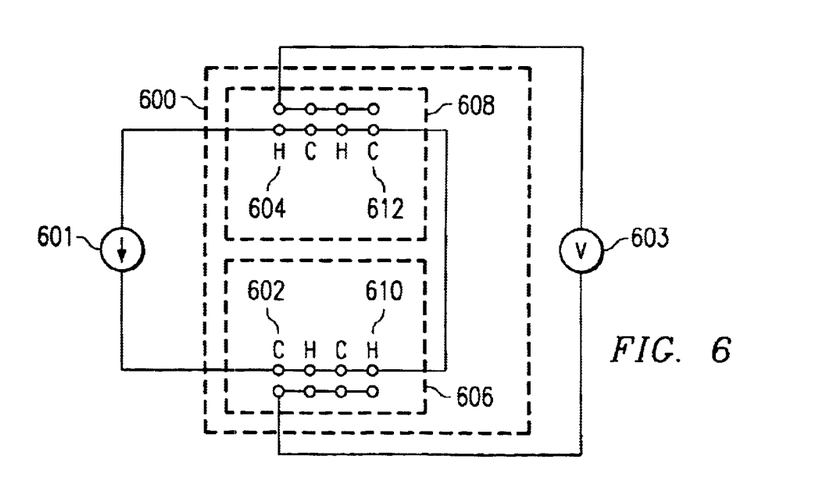
FIG. 6 is a schematic diagram of a thermal sensor incorporating the cross-coupled current sensors of FIG. 5.

FIG. 6 depicts a symbolic representation of a basic cross-coupled current sensor circuit 600 employing a pair of cross-coupled current sensors. The current sensor circuit 600 includes a sampled current 601 coupled to a plurality of a first pair of cross coupled current sensors 606 that are configured as depicted in FIG. 5. The first pair of cross-coupled current sensors receives the sampled current at a cold terminal 602 and the current exits the first pair of cross-coupled current sensors 606 via a hot terminal 610. The current is then passed onto a second pair of cross-coupled current sensors 608 and is received at a cold terminal 612 and exits the second pair of cross-coupled current sensor 608 via hot terminal 604. Although only one pair of cross-coupled current sensors are depicted, there may be any even number, n, of current sensors used as depicted. Each current sensor includes a pair of temperature generating junctions and a corresponding pair of temperature difference sensors, where each temperature difference sensor can include 2m pair of temperature sensing junctions, where there are m temperature sensing junctions for each temperature generating junction. A constant K is used to describe the temperature difference generator and sensor characteristics and the thermal transfer therebetween. The value of K will change depending on the dielectric constant of the material disposed between the thermal difference generator and sensor and whether a Faraday shield 618 is used. The output signal 603 is then given by:

$$E_{out} = I * K * n * m \tag{1}$$

Figure 7:
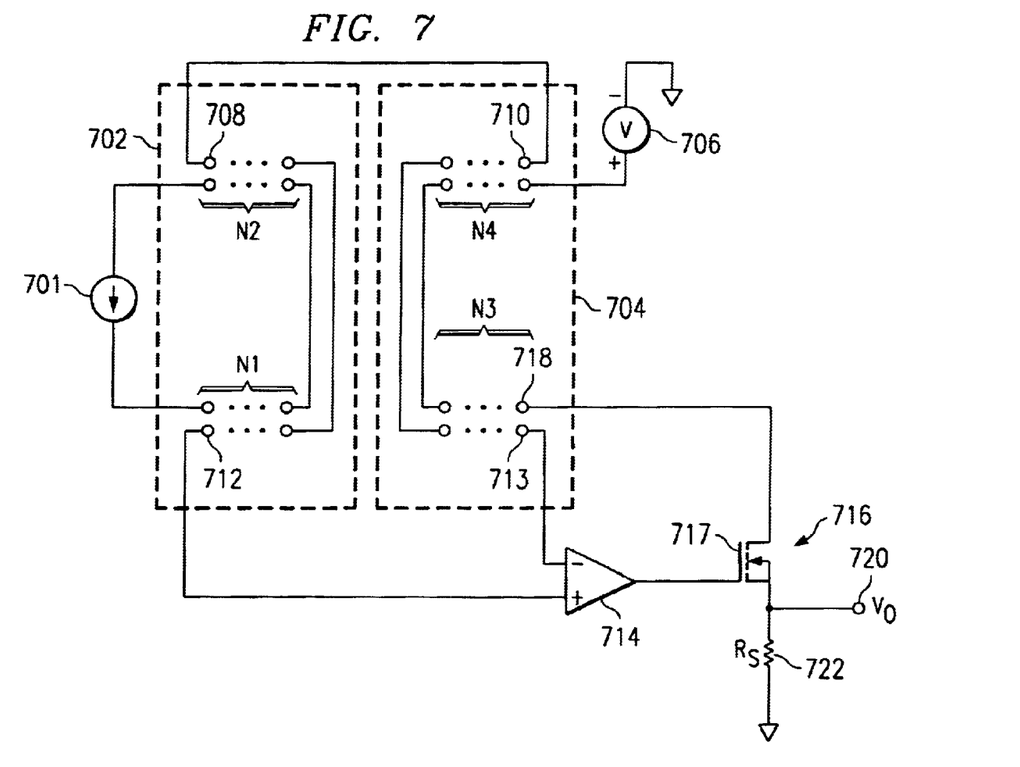
FIG. 7 is a schematic diagram of a thermal sensor and a bridge null circuit.

FIG. 7 depicts a dual cross coupled current sensor with a bridge null circuit. FIG. 7 depicts a current sensor having a sampled current 701 coupled to a first current sensor module 702 that includes a plurality of cross-coupled current sensors as described with respect to FIG. 6. A second current sensor module 704 that includes a plurality of cross-coupled current sensors as described with respect to FIG. 6 is coupled to a voltage supply source 706. An output terminal 708 of the thermal difference sensor contained within the first current sensor module 702 is coupled to a first terminal 710 of the thermal difference sensor contained within the current second current sensing module 704. A second output terminal 712 is coupled to one input terminal of an op-amp 714. A second output terminal 713 of the thermal difference sensor contained within the second current sensing module 704 is coupled to the other input terminal of the op-amp 714. A MOSFET 716 has a gate terminal 717 coupled to the output of op-amp 714 and a drain terminal coupled to the terminal 718 of the temperature difference generator of the second current sensing module 704. The first current sensing module 702 can include N1 thermal difference generators and N2 temperature sensing junctions per thermal difference generator, the second current sensing module 704 can include N3 temperature difference generators and N4 temperature sensing junctions per thermal difference generator. The output current from voltage supply source 706 is given by:

$$I_{out} = I_{706} * (N1/N4) * (N2/N3) \tag{2}$$

and the output voltage 720 is given by $$V_o = I_{706} * Rs \tag{3}$$

Preferentially, N2/N1=N3/N4. In operation, if the temperature difference within the first current sensing module 702 is greater than the second current sensing module 704, the op-amp 714 will have a positive output voltage and turn on the MOSFET 716, drawing current from the voltage supply source 706 and forming output voltage $V_o$ 720 across resistor 722, Rs. The current that is drawn from the voltage supply source 706 flows through the temperature difference generator of the second current sensing module 704, causing the temperature difference therein to increase. The current through $R_s$ 722 is adjusted until the temperature difference within 702 and 704 are equal. When the two sensed temperatures are equal, the input of the Op-amp 714 is zero and the circuit has been servo'd to zero or nulled. Preferentially, the first and second current sensing modules 702 and 704 are constructed to have the same K value, as described above.

Those of ordinary skill in the art should further appreciate that variations to and modification of the above-described methods and apparatus for current measurement can be made. Accordingly, the invention should be viewed as limited solely by the scope and spirit of the appended claims.

What is claimed is:

1. A current sensor formed on a silicon die for measuring a sampled current, the current sensor comprising:
   a first thermal difference generator formed on the silicon die, the first thermal difference generator having a current input portion consisting of a first conductive material;
   the first thermal difference generator including
      a current transfer portion consisting of a second conductive material dissimilar to the first conductive material, the current transfer portion physically coupled to the current input portion and forming a first temperature generating junction therewith;
      a current output portion consisting of the first conductive material, the current output portion physically coupled to the current transfer portion forming a second temperature generating junction therewith, the first temperature generating junction and the second temperature generating junction being spaced apart on the silicon die,
      the sampled current coupled to the current input portion of the first thermal difference generator and the thermal difference generator providing the sampled current as an output from the current output portion, the sampled current flowing through the current input portion, the first junction, the current transfer portion, the second junction, and through the current output portion and generating a first temperature at the first junction and a second temperature at the second junction, wherein the first temperature is less than the second temperature;
   a first thermal difference sensor having a first output portion consisting of a third conductive material and including;
      a current transfer portion consisting of a fourth conductive material dissimilar to the third conductive material, the current transfer portion physically coupled to the first output portion forming a first temperature sensing junction;
      a second output portion consisting of the third conductive material, the second output portion physically coupled to the current transfer portion forming a second temperature sensing junction spaced apart from the first temperature sensing junction;
      the first temperature sensing junction spaced apart from and thermally coupled to the first temperature generating junction, and the second temperature sensing junction spaced apart from and thermally coupled to the second temperature generating junction, the thermal difference sensor providing an output signal on the first and second output portions that is a function of the temperature difference between the first and second temperatures; and
   a dielectric barrier interposed between the first temperature generating junction and the first temperature sensing junction and the second temperature generating function and the second temperature sensing junction.

2. The current sensor of claim 1 wherein the current input portion is physically coupled to the current transfer portion by a first via and the current transfer portion conducting the sampled current to a second via, the second via spaced apart from the first via, and the second via interconnecting the current transfer portion to the current output portion.

3. The current sensor of claim 1 wherein the first temperature sensing junction includes a plurality of first temperature sensing junctions, each spaced apart from and thermally coupled to the first temperature generating junction, and wherein the second temperature sensing junction includes a plurality of second temperature sensing junctions, each spaced apart from and thermally coupled to the second temperature generating junction.

4. The current sensor of claim 1 wherein the first conductive material is copper and the second conductive material is aluminum.

5. The current sensor of claim 1 wherein the third conductive material is aluminum and the fourth conductive material is polysilicon.

6. The current sensor of claim 1 wherein the dielectric layer is silicon dioxide.

7. The current sensor of claim 1 wherein the dielectric layer is polymide.

8. The current sensor of claim 1, wherein the dielectric surrounding the thermal junction is air.

9. The current sensor of claim 1 further comprising a faraday shield interposed between the thermal difference generator and the thermal difference sensor.

10. The current sensor of claim 9 wherein the faraday shield is composed of aluminum.

11. The current sensor of claim 1 further including:
   a second thermal difference generator electrically coupled to the first thermal difference generator such that the current output portion of the first thermal difference generator is adjacent to the current input portion of the second thermal difference generator, wherein the second temperature generating junction of the first thermal difference generator is adjacent to the first temperature generating junction of the second thermal difference generator; and
   a second thermal difference sensor electrically coupled to the first thermal difference sensor such that the second output portion of the first thermal difference sensor is electrically coupled to the first output portion of the second thermal difference sensor.

12. A method of measuring current on a silicon die, the method comprising the steps of:
   receiving a sampled current on the silicon die;
   generating a first temperature at a first location on the silicon die and a second temperature at a second location on the silicon die spaced apart from the first location, the first and second temperatures having a first temperature difference therebetween, wherein the first temperature difference between the first and second temperature is a function of the sampled current;

sensing at least a portion of the first temperature on the silicon die and at least a portion of the second temperature on the silicon die, and forming a second temperature difference;

generating an output signal on the silicon die that is a function of the second temperature difference.

* * * * *